US011177647B2

(12) United States Patent
Katsukura et al.

(10) Patent No.: US 11,177,647 B2
(45) Date of Patent: Nov. 16, 2021

(54) GROUND FAULT DETECTOR AND POWER CONDITIONER WITH INPUT-SIDE GROUND FAULT DETECTION

(71) Applicant: TOSHIBA MITSUBISHI-ELECTRIC INDUSTRIAL SYSTEMS CORPORATION, Chuo-ku (JP)

(72) Inventors: Tomoya Katsukura, Tokyo (JP); Tomonori Ujiie, Tokyo (JP); Masahiro Kinoshita, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 23 days.

(21) Appl. No.: 16/494,452

(22) PCT Filed: Jul. 18, 2017

(86) PCT No.: PCT/JP2017/025962
§ 371 (c)(1),
(2) Date: Sep. 16, 2019

(87) PCT Pub. No.: WO2019/016867
PCT Pub. Date: Jan. 24, 2019

(65) Prior Publication Data
US 2021/0063494 A1 Mar. 4, 2021

(51) Int. Cl.
*H02H 7/122* (2006.01)
*H02H 3/16* (2006.01)
(Continued)

(52) U.S. Cl.
CPC .............. *H02H 7/122* (2013.01); *H02H 3/16* (2013.01); *G01R 31/52* (2020.01); *H02H 3/04* (2013.01); *H02M 7/537* (2013.01)

(58) Field of Classification Search
CPC ........ G01R 31/52; H02M 7/537; H02M 1/32; H02M 7/42–5395; H03K 5/24; H02H 3/16–17; H02H 7/122–1227
See application file for complete search history.

(56) References Cited

U.S. PATENT DOCUMENTS 5,103,365 A * 4/1992 Uchida ................ H02H 1/0015
361/102
9,069,025 B2 * 6/2015 Schaefer ................ G01R 27/18
(Continued)

FOREIGN PATENT DOCUMENTS

CN 102033186 A 4/2011
JP 9-84254 A 3/1997
(Continued)

OTHER PUBLICATIONS

Combined Chinese Office Action and Search Report dated Dec. 29, 2020 in corresponding Chinese Patent Application No. 201780092257.6 (with English Translation and English Translation of Category of Cited Documents), 15 pages.
(Continued)

*Primary Examiner* — Fred E Finch, III
(74) *Attorney, Agent, or Firm* — Oblon, McClelland, Maier & Neustadt, L.L.P.

(57) ABSTRACT

A power conditioner includes an inverter circuit that converts a DC voltage into an AC voltage, a voltage dividing circuit having one end connected to the positive electrode input terminal and the other end connected to the negative electrode input terminal, and a ground fault detector configured to receive a voltage divided by the voltage dividing circuit as an input voltage signal and to detect an occurrence of a ground fault based on the magnitude of the voltage of the input voltage signal. the ground fault detector emits an AC ground fault detection signal when the input voltage signal includes a first voltage signal having a frequency
(Continued)

equal to or higher than a predetermined first frequency and a deviation of the first voltage signal with respect to an AC ground reference potential is equal to or larger than an AC ground fault detection voltage.

4 Claims, 4 Drawing Sheets

(51) Int. Cl.
*H02M 7/537* (2006.01)
*H02H 3/04* (2006.01)
*G01R 31/52* (2020.01)

(56) References Cited

U.S. PATENT DOCUMENTS

| | | | | |
|---|---|---|---|---|
| 2007/0268636 | A1* | 11/2007 | Suzuki | G01R 31/52 |
| | | | | 361/48 |
| 2012/0043967 | A1 | 2/2012 | Miura et al. | |
| 2012/0086458 | A1* | 4/2012 | Wei | H02H 3/16 |
| | | | | 324/509 |
| 2013/0218491 | A1* | 8/2013 | Wei | G01R 31/52 |
| | | | | 702/58 |
| 2013/0322133 | A1* | 12/2013 | Li | H02H 3/52 |
| | | | | 363/37 |
| 2015/0091582 | A1* | 4/2015 | Wei | G01R 31/42 |
| | | | | 324/509 |
| 2015/0097571 | A1* | 4/2015 | Wei | G01R 31/52 |
| | | | | 324/531 |
| 2016/0245853 | A1* | 8/2016 | Weiss | G01R 31/42 |
| 2017/0131340 | A1* | 5/2017 | Tallam | G01R 31/40 |
| 2017/0131341 | A1* | 5/2017 | Hu | B60L 3/12 |
| 2019/0219621 | A1* | 7/2019 | Morimoto | B60L 58/24 |
| 2020/0223313 | A1* | 7/2020 | Ishida | G01R 31/52 |

FOREIGN PATENT DOCUMENTS

| | | |
|---|---|---|
| JP | 2001-218474 A | 8/2001 |
| JP | 2015-156747 A | 8/2015 |
| JP | 2016-100962 A | 5/2016 |

OTHER PUBLICATIONS

International Search Report dated Sep. 19, 2017 in PCT/JP2017/025962 filed Jul. 18, 2017.
English translation of the International Preliminary Report on Patentability dated Jan. 30, 2020, in PCT/JP2017/025962, 6 pages.
Office Action dated Aug. 24, 2020 in corresponding Indian Patent Application No. 201917036432 (with English Translation), 6 pages.

* cited by examiner

… (1)

GROUND FAULT DETECTOR AND POWER CONDITIONER WITH INPUT-SIDE GROUND FAULT DETECTION

TECHNICAL FIELD

The present invention relates to a ground fault detector and a power conditioner.

BACKGROUND

A power conditioner includes an inverter circuit. DC voltage from a photovoltaic panel is inputted to an input side of the inverter circuit. If a ground fault occurs in a path from the photovoltaic panel to the input side of the inverter circuit, a DC ground fault occurs. In order to detect the DC ground fault, a ground fault detector is provided on the input side of the inverter circuit. In this regard, conventionally, as disclosed in, for example, Japanese Patent Laid-Open No. 2001-218474, an apparatus for detecting a ground fault of a circuit including an inverter circuit is known.

In the inverter circuit, DC-AC conversion is performed, and an AC current flows to an output side of the inverter circuit. Apart from a DC ground fault on the input side, an AC ground fault occurs on the AC side. Conventionally, a ground fault overvoltage relay (so-called OVGR) has been provided on the output side of the inverter circuit in a power conditioner as a ground fault detector for detecting the AC ground fault.

PRIOR ART DOCUMENT

Patent Document

[Patent Document 1] Japanese Patent Publication No. 2001-218474

SUMMARY

Problems to be Solved by the Invention

Conventionally, in order to accurately detect the AC ground fault, it is necessary to provide a ground fault detector on the inverter circuit output side. As a result, there has been a problem that the circuit configuration on the output side of the inverter circuit becomes complicated and a problem that a space for installing the circuit increases. As a result of intensive studies, the inventor has found a novel device configuration capable of detecting the AC ground fault without using the OVGR on the output side of the inverter circuit.

The present invention has been made to solve the problems as described above, and to provide a ground fault detector and a power conditioner capable of detecting the AC ground faults separately without using a ground fault detector at the output side of the inverter circuit.

Solution to Problem

A power conditioner according to the present invention includes: an inverter circuit converting a DC voltage inputted via a positive electrode input terminal and a negative electrode input terminal into an AC voltage; a voltage dividing circuit having one end connected to the positive electrode input terminal and another end connected to the negative electrode input terminal; and a ground fault detector receiving a voltage divided by the voltage dividing circuit as an input voltage signal, and detecting an occurrence of a ground fault based on a magnitude of a voltage of the input voltage signal, wherein the ground fault detector emits an AC ground fault detection signal when the input voltage signal includes a first voltage signal having a frequency equal to or higher than a predetermined first frequency and a deviation of the first voltage signal with respect to a predetermined AC ground reference potential is equal to or larger than a predetermined AC ground fault detection voltage.

A ground fault detector according to the present invention includes: a frequency filter receiving an input voltage signal, passing a first voltage signal having a frequency equal to or higher than a predetermined first frequency, and blocking a signal having a frequency lower than the first frequency; a low pass filter receiving the input voltage signal, passing a second voltage signal having a frequency equal to or lower than a second frequency determined lower than the first frequency, and blocking a signal having a frequency higher than the second frequency; and a voltage comparison unit generating an AC ground fault detection signal when a deviation of the first voltage signal with respect to a predetermined AC ground fault reference potential is equal to or greater than a predetermined AC ground fault detection voltage, and generating a DC ground fault detection signal when a deviation of the second voltage signal with respect to a predetermined DC ground fault reference potential is equal to or greater than a predetermined DC ground fault detection voltage.

Advantageous Effect of the Invention

Since the AC ground fault waveform is transmitted from the output side to the input side in the inverter circuit, the input-side ground fault detector for DC ground fault detection can also detect the AC ground fault waveform. Since there is a difference in voltage waveform between the DC ground fault and the AC ground fault, it is possible to detect the AC ground fault based on this difference in the waveform when a signal of a first frequency or higher is included. Thereby, the AC ground fault can be distinguished and detected by the ground fault detector on the inverter circuit input side.

DETAILED DESCRIPTION OF THE EMBODIMENTS

Figure 1:
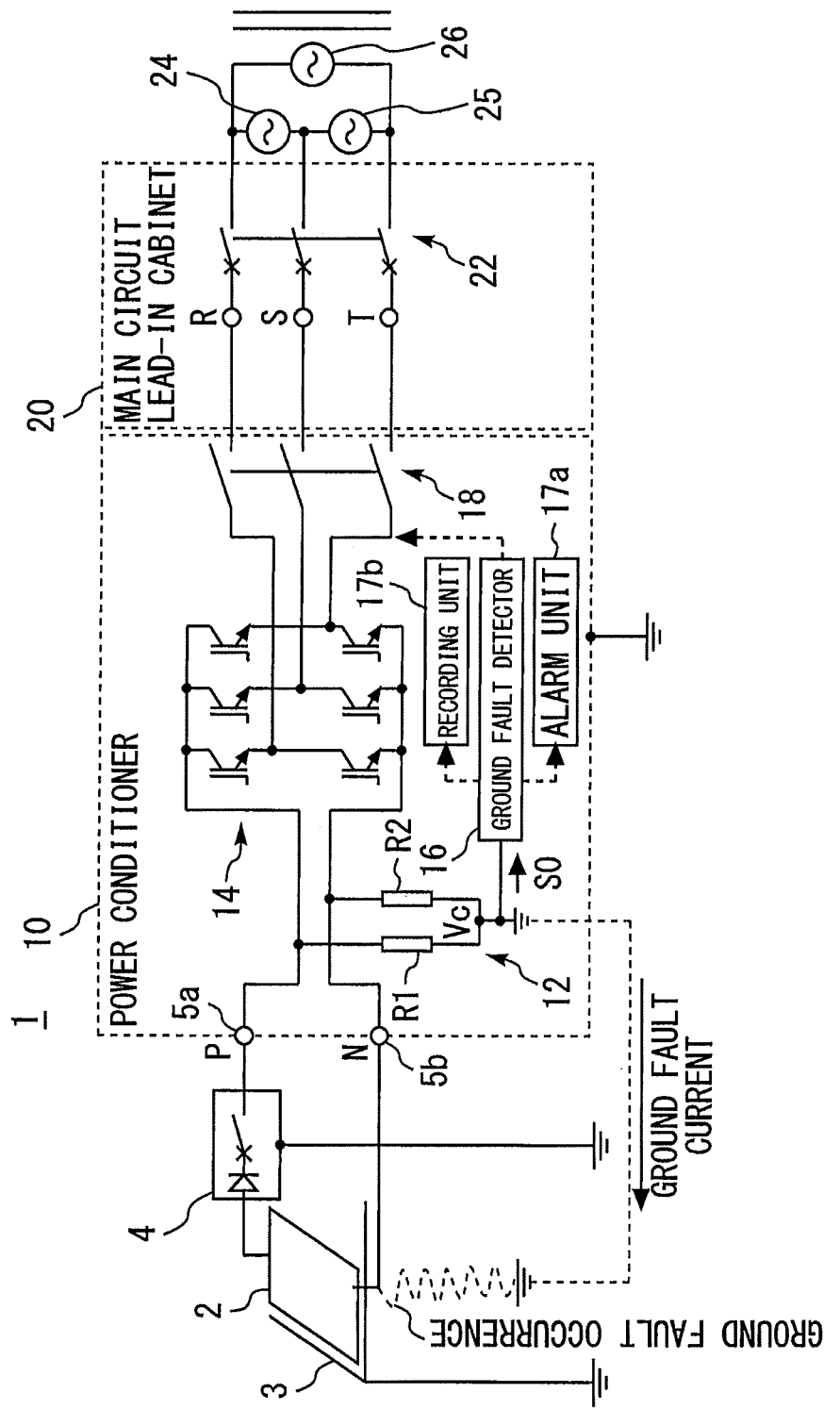
FIG. 1 is a circuit block diagram showing a power system including a ground fault detector and a power conditioner according to an embodiment of the present invention.

FIG. 1 is a circuit block diagram showing a power system 1 including a ground fault detector 16 and a power conditioner 10 according to an embodiment of the present invention. In the embodiment, the power system 1 is a photovoltaic system as an example. The power system 1 includes a photovoltaic panel 2 as a DC power supply, a mount frame 3 for fixing the photovoltaic panel 2, a connection box 4 interposed between the photovoltaic panel 2 and the power conditioner 10, the power conditioner 10 configured to convert a DC power into an AC power, and a main circuit lead-in cabinet 20. The power system 1 is connected to grid power sources 24 to 26 and a home appliance load (not shown) via the main circuit lead-in cabinet 20. The main circuit lead-in cabinet 20 is provided with a main circuit breaker 22.

The power conditioner 10 includes a positive electrode input terminal 5a, a negative electrode input terminal 5b, an inverter circuit 14, a voltage dividing circuit 12, a ground fault detector 16, an alarm unit 17a, a recording unit 17b, and a breaker 18. The inverter circuit 14 converts a DC voltage inputted via the positive electrode input terminal 5a and the negative electrode input terminal 5b into an AC voltage. The inverter circuit 14 is a three-phase inverter circuit having three phases of R, S, and T, and has three sets of arm circuits each configured by two semiconductor switching elements.

The voltage dividing circuit 12 is a series circuit of a resistor R1 and a resistor R2. One end of the voltage dividing circuit 12 is connected to the positive electrode input terminal 5a, and the other end of the voltage dividing circuit 12 is connected to the negative electrode input terminal 5b. The connection point between the resistor R1 and the resistor R2 is grounded. The voltage at the connection point between the resistor R1 and the resistor R2 is a neutral point potential Vc.

The neutral point potential Vc is inputted to the ground fault detector 16 as an input voltage signal S0. The ground fault detector 16 detects that a ground fault has occurred based on a magnitude of the voltage of the input voltage signal S0. The ground fault detector 16 is connected to the alarm unit 17a, the recording unit 17b, and the breaker 18. The breaker 18 is provided on the output side of the inverter circuit 14. When the breaker 18 operates, the electrical path between the power conditioner 10 and the main circuit lead-in cabinet 20 is disconnected. In FIG. 1, a ground fault current path at the time of occurrence of a DC ground fault is illustrated by a broken line.

Figure 2:
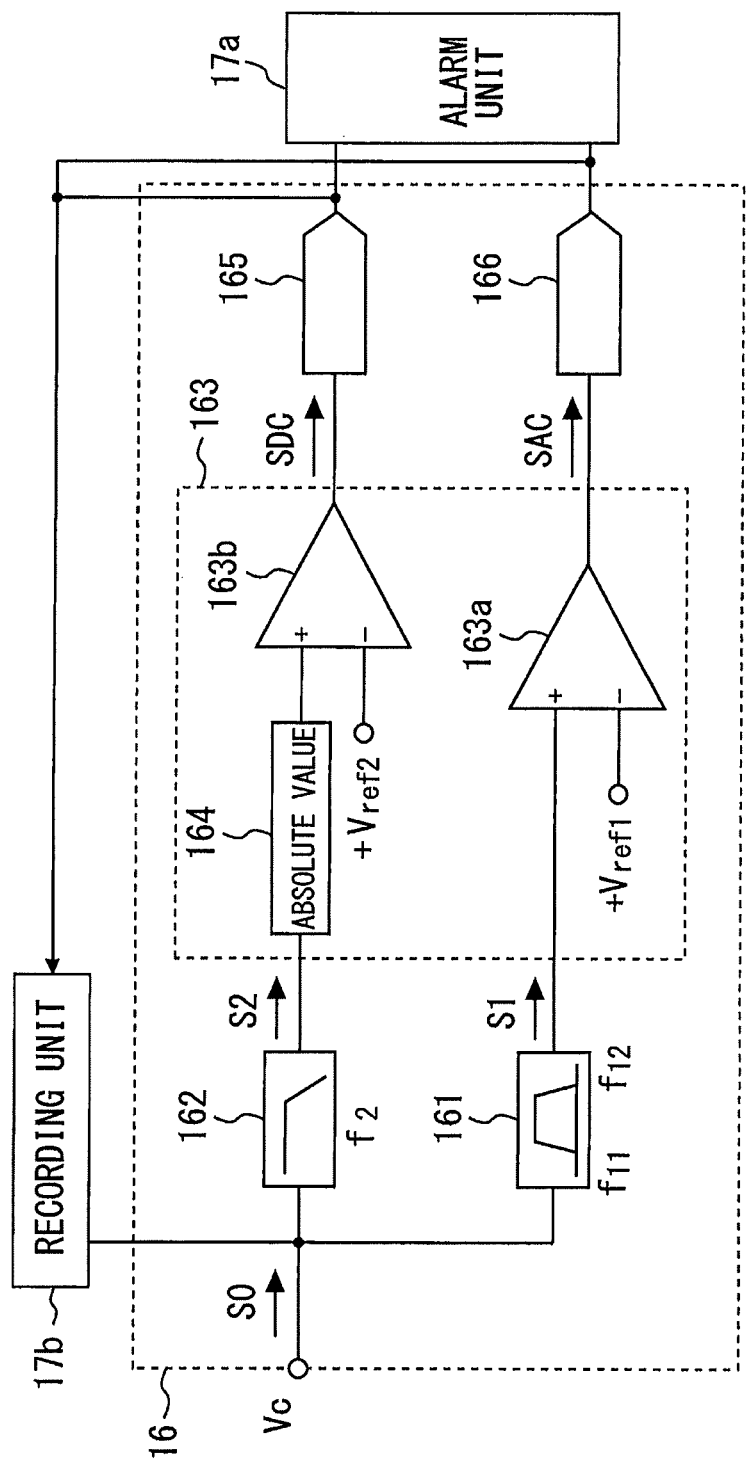
FIG. 2 is a circuit block diagram of a ground fault detector according to an embodiment of the present invention.

FIG. 2 is a circuit block diagram of the ground fault detector 16 according to the embodiment of the present invention. The ground fault detector 16 includes a frequency filter 161, a low pass filter 162, a voltage comparison unit 163, a DC ground fault detection terminal 165, and an AC ground fault detection terminal 166.

The frequency filter 161 is a band pass filter. The frequency filter 161 passes only signals having frequencies within a predetermined frequency range. That is, the frequency filter 161 can block a signal having a frequency lower than a first frequency f11 and a signal having a frequency higher than a third frequency f12. Therefore, when the input voltage signal S0 is input to the frequency filter 161, the frequency filter 161 can pass only a first voltage signal S1 having a frequency equal to or higher than the first frequency f11 and equal to or lower than the third frequency f12. The third frequency f12 is set higher than the first frequency f11. Specifically, the first frequency f11 may be 45 Hz, and the third frequency f12 may be 65 Hz. As a result, only signals having a frequency of 45 Hz to 65 Hz can be selectively passed, so that an electrical signal having a frequency of 50 Hz or 60 Hz can be accurately extracted from the input voltage signal S0. It should be noted that the numerical value of the frequency is an example.

When the input voltage signal S0 is input to the low pass filter 162, the low pass filter 162 blocks a signal having a frequency higher than a second frequency f2. Therefore, the low pass filter 162 can pass only a second voltage signal S2 having a frequency equal to or lower than the second frequency f2. The second frequency f2 is a frequency determined lower than the first frequency f11. The second frequency f2 may be 5 hertz or 1 hertz. As a result, only a signal having a sufficiently low frequency can be selectively passed, so that it is possible to remove frequency components caused by an AC ground fault and to detect only voltage fluctuations caused by a DC ground fault. It should be noted that the numerical value of the frequency is an example.

Figure 3:
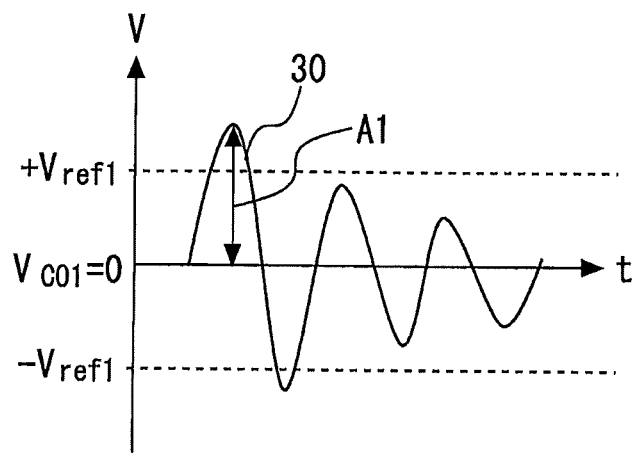
FIG. 3 is a waveform chart for explaining the operation of the ground fault detector according to the embodiment of the present invention.
Figure 4:
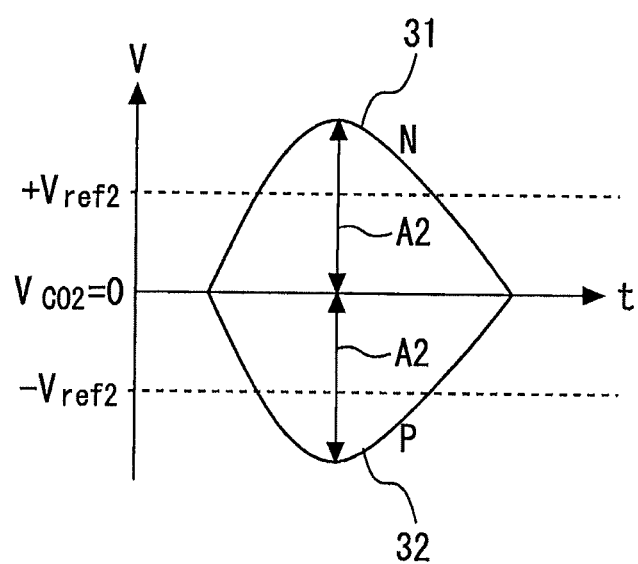
FIG. 4 is a waveform chart for explaining the operation of the ground fault detector according to the embodiment of the present invention.

The voltage comparison unit 163 includes a first comparator 163a, an absolute value generation unit 164, and a second comparator 163b. The voltage comparison unit 163 compares the first voltage signal S1 and the second voltage signal S2 with an AC ground fault detection voltage $V_{ref1}$ and a DC ground fault detection voltage $V_{ref2}$ which are predetermined voltages. Hereinafter, the ground fault detection operation of the ground fault detector 16 will be described together with the configuration of the voltage comparison unit 163 with reference to FIGS. 2 to 4. FIGS. 3 and 4 are waveform diagrams for explaining the operation of the ground fault detector 16 according to the embodiment of the present invention.

First, the detection operation of the AC ground fault will be described. When the voltage value of the first voltage signal S1 becomes equal to or higher than the AC ground fault detection voltage $V_{ref1}$, the output signal of the first comparator 163a becomes high. This high signal is an AC ground fault detection signal SAC. The AC ground fault detection signal SAC is outputted to the outside of the ground fault detector 16 via the AC ground fault detection terminal 166.

FIG. 3 illustrates an AC ground fault waveform 30. At the time of AC ground fault shown in FIG. 3, the neutral point potential Vc periodically changes. This fluctuation is due to the voltage frequency on the output side of the inverter circuit 14. The inverter circuit 14 outputs a voltage of 50 hertz or 60 hertz because a grid interconnection system is constructed with the grid power sources 24 to 26 which are commercial grids. Thus, the periodic fluctuation of the neutral point potential Vc at the occurrence of the AC ground fault has a frequency of 50 Hz or 60 Hz.

Since the input voltage signal S0 has a frequency of 50 Hz or 60 Hz at the time of the AC ground fault, the input voltage signal S0 is blocked by the low pass filter 162, while the input voltage signal S0 passes through the frequency filter 161 and becomes the first voltage signal S1. The first voltage signal S1 is compared with the AC ground fault detection voltage $V_{ref1}$ by the first comparator 163a. As shown in FIG. 3, when a deviation A1 of the first voltage signal S1 with respect to the AC ground fault reference potential $V_{C01}$ is equal to or greater than the AC ground fault detection voltage $V_{ref1}$, the first comparator 163a emits the AC ground fault detection signal SAC. By distinguishing and detecting the AC ground fault, it is possible to quickly identify that the output side of the inverter circuit 14 has a failure.

Although the deviation A1 on the positive potential side of the first voltage signal S1 with respect to the AC ground fault reference potential $V_{C01}$ may be compared with $+V_{ref1}$ which is the AC ground fault detection voltage as shown in FIG. 3, the present invention is not limited thereto. As a modification, the deviation on the negative potential side of the first voltage signal S1 with respect to the AC ground fault reference potential $V_{C01}$ may be compared with $-V_{ref1}$.

Next, the detection operation of the DC ground fault will be described. The absolute value generation unit 164 converts the voltage value of the second voltage signal S2 into an absolute value. When the absolute value of the second voltage signal S2 becomes equal to or higher than the DC ground fault detection voltage $V_{ref2}$, the output signal of the second comparator 163*b* becomes high. This high signal is a DC ground fault detection signal SDC. The DC ground fault detection signal SDC is outputted to the outside of the ground fault detector 16 via the DC ground fault detection terminal 165.

In FIG. 4, an N-phase DC ground fault waveform 31 and a P-phase DC ground fault waveform 32 are illustrated. At the time of the DC ground fault shown in FIG. 4, the neutral point potential Vc fluctuates in only one direction to the P side or the N side. In a case of the DC ground fault, only one peak or valley waveform appears in the neutral point potential Vc, and the neutral point potential Vc does not repeat cyclical fluctuation.

Since the input voltage signal S0 has only a sufficiently low frequency when the DC ground fault occurs, the input voltage signal S0 passes through the low pass filter 162 and becomes the second voltage signal S2, while the input voltage signal S0 is blocked at the frequency filter 161. The second voltage signal S2 is converted into an absolute value and then compared with the DC ground fault detection voltage $V_{ref2}$ by the second comparator 163*b*. As shown in FIG. 4, when a deviation A2 of the second voltage signal S2 with respect to the DC ground fault reference potential $V_{C02}$ is greater than or equal to the DC ground fault detection voltage $V_{ref2}$, the second comparator 163*b* emits the DC ground fault detection signal SDC. By distinguishing and detecting the DC ground fault, it is possible to quickly identify that the input side of the inverter circuit 14 has a failure.

When both of the DC ground fault and the AC ground fault occur, the low frequency component of the input voltage signal S0 passes through the low pass filter 162 to become the second voltage signal S2, while the high frequency component of the input voltage signal S0 passes through the frequency filter 161 to become the first voltage signal S1. Since the above-mentioned AC ground fault detection and DC ground fault detection operate independently of each other, both the AC ground fault detection signal SAC and the DC ground fault detection signal SDC are outputted.

In the first embodiment, the neutral point potential Vc of the voltage dividing circuit 12 is set to a ground potential. Since the ground fault is detected based on the voltage fluctuation from the neutral point potential Vc, the AC ground fault reference potential $V_{C01}$ and the DC ground fault reference potential $V_{C02}$ are set to zero volts. The AC ground fault reference potential $V_{C01}$ and the AC ground fault detection voltage $V_{ref1}$ can be predetermined as values for accurately detecting the AC ground fault, and the DC ground fault reference potential $V_{C02}$ and the DC ground fault detection voltage $V_{ref2}$ can be predetermined as a value for accurately detecting the DC ground fault. The detection conditions of the DC ground fault and the AC ground fault may be common or may be different from each other. The AC ground fault reference potential $V_{C01}$ and the DC ground fault reference potential $V_{C02}$ may be the same potential, or more specifically, both may be zero volts. Alternatively, one of the AC ground fault reference potential $V_{C01}$ and the DC ground fault reference potential $V_{C02}$ may be set higher than the other so that these values may be set to different potentials. The AC ground fault detection voltage $V_{ref1}$ and the DC ground fault detection voltage $V_{ref2}$ may have the same voltage value, or may have different voltage values by setting one of them higher than the other.

Since the AC ground fault waveform is transmitted from the output side to the input side of the inverter circuit 14, the AC ground fault waveform is also inputted to the ground fault detector 16 provided on the input side of the inverter circuit 14. Since there is a difference in the voltage waveform between the DC ground fault and the AC ground fault, the AC ground fault can be detected based on this waveform difference when a signal having a frequency equal to or higher than the first frequency f11 is included, according to the embodiment. Thereby, the AC ground fault can be distinguished and detected by the ground fault detector 16 on the input side of the inverter circuit 14. The AC ground fault can be distinguished and detected without using the OVGR on the output side of the inverter circuit 14. Furthermore, since the ground fault detector 16 according to the embodiment emits the DC ground fault detection signal SDC and the AC ground fault detection signal SAC separately, it is possible to distinguish an occurrence of only the DC ground fault, an occurrence of only the AC ground fault, and an occurrence of both the DC ground fault and the AC ground fault from one another.

The alarm unit 17*a* outputs an alarm of the AC ground fault in response to the AC ground fault detection signal SAC, and outputs an alarm of the DC ground fault in response to the DC ground fault detection signal SDC. When both the AC ground fault and the DC ground fault occur, it is possible to output alarms of both the AC ground fault and the DC ground fault. The recording unit 17*b* records a ground fault occurrence history in response to the AC ground fault detection signal SAC and the DC ground fault detection signal SDC. The recording unit 17*b* can record the waveform of the input voltage signal S0 in a readable recording medium when at least one of the DC ground fault and the AC ground fault occurs. By removing the readable recording medium from the recording unit 17*b*, it is possible to allow the external computer to read the ground fault waveform. When the ground fault detector 16 emits at least one of the DC ground detection signal SDC and the AC ground detection signal SAC, breaker 18 is tripped.

Figure 5:
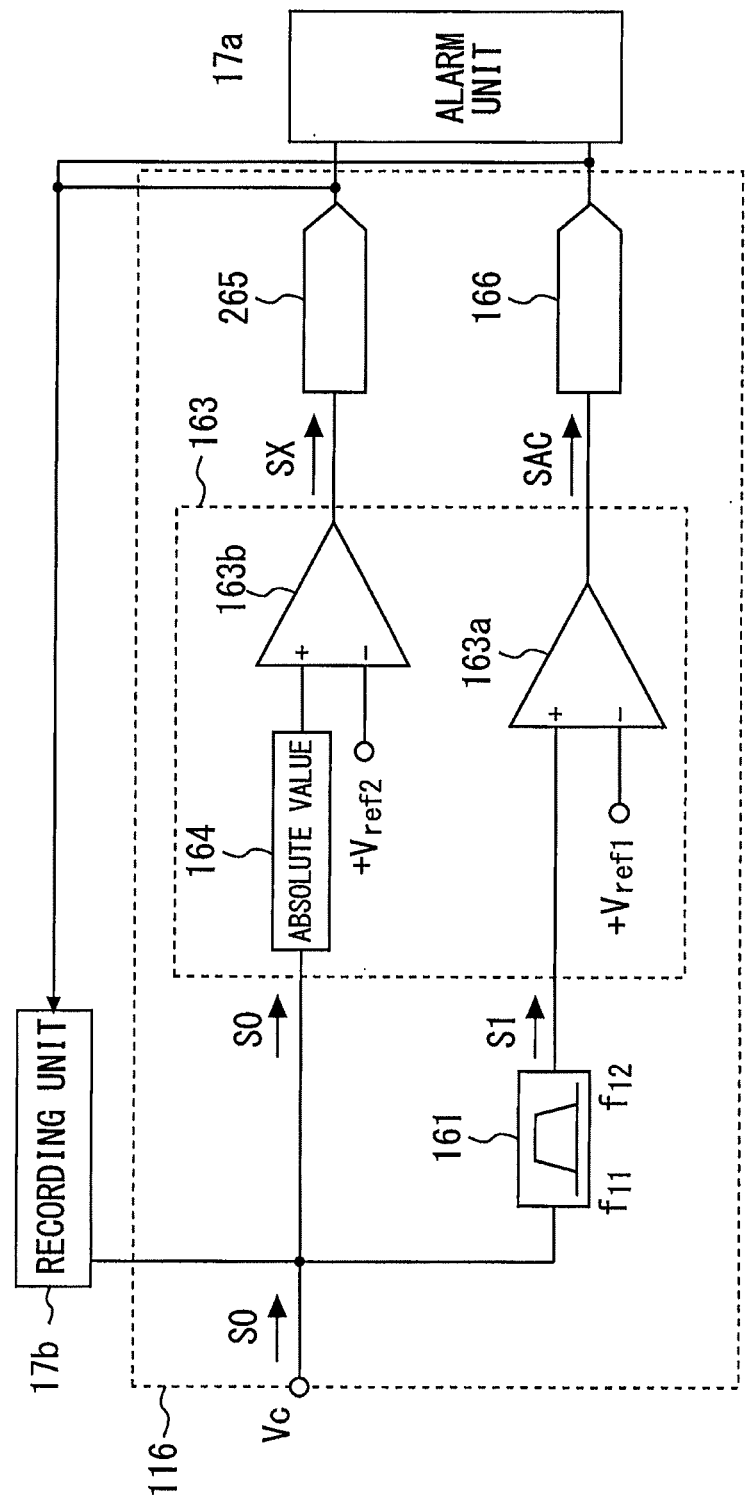
FIG. 5 is a circuit block diagram of a ground fault detector according to a modification of the embodiment of the present invention.

FIG. 5 is a circuit block diagram of a ground fault detector 116 according to a modification of the embodiment of the present invention. The ground fault detector 116 does not include the low pass filter 162, and includes a ground fault detection terminal 265 in place of the DC ground fault detection terminal 165. Since there is no low pass filter 162, the input voltage signal S0 is input to the voltage comparison unit 163 as it is. The absolute value generation unit 164 inputs the absolute value of the input voltage signal S0 to the second comparator 163*b*.

First, when the DC fault occurs, in the ground fault detector 116, the absolute value of the DC ground fault waveform of FIG. 4 is inputted to the second comparator 163*b*. Therefore, also in the ground fault detector 116, the DC ground fault is detected similarly to the ground fault detector 16 by the voltage comparison in the second comparator 163*b*. In this case, the ground fault detector 116 outputs a ground fault detection signal SX from the ground fault detection terminal 265. Further, since the frequency filter 161 is provided, the AC ground fault detection signal SAC is not output.

On the other hand, when the AC ground fault occurs, in the ground fault detector 116, the AC ground fault waveform 30 of FIG. 3 passes through the frequency filter 161 and is inputted to the first comparator 163a. As a result, the AC ground fault is detected, and the AC ground fault detection signal SAC is outputted from the AC ground fault detection terminal 166. Furthermore, since the ground fault detector 116 does not have the low pass filter 162, the AC ground fault waveform 30 is converted by the absolute value generation unit 164 and then is inputted to the second comparator 163b. As a result, the ground fault detection signal SX is output from the ground fault detection terminal 265 even when the AC ground fault occurs.

The ground fault detector 116 outputs the ground detection signal SX when at least one of the AC ground fault and the DC ground fault is detected based on the magnitude of the voltage of the input voltage signal S0. Furthermore, it is also possible to distinguish between the AC ground fault and the DC ground fault based on the presence or absence of the AC ground fault detection signal SAC.

In the circuit configurations of FIGS. 2 and 5, the P-phase DC ground fault waveform 32 and the N-phase DC ground fault waveform 31 are compared with the same DC ground fault detection voltage $V_{ref2}$ by providing the absolute value generation unit 164, however it is not necessarily limited to this configuration. As a modification, the voltage fluctuation to the minus side may be compared with $-V_{ref2}$ shown in FIG. 3 without taking an absolute value. As a further modification, the positive and negative of the voltage may be distinguished to distinguish and detect the P-phase ground fault and the N-phase ground fault, the difference between the P-phase ground fault and the N-phase may be outputted by the alarm unit 17a, or these results may be recorded by the recording unit 17b. By determining not only the absolute value but also the presence or absence of the polarity on the DC ground detection side, it may be more accurately specified which of the P-phase and N-phase wiring has a failure.

REFERENCE SIGNS LIST 1 power system, 2 photovoltaic panel, 3 mount frame, 4 connection box, 5a positive electrode input terminal, 5b negative electrode input terminal, 10 power conditioner, 12 voltage dividing circuit, 14 inverter circuit, 16, 116 ground fault detector, 17a alarm unit, 17b recording unit, 18 breaker, 20 main circuit lead-in cabinet, 22 main circuit breaker, 24 to 26 grid power source, 30 AC ground fault waveform, 31 phase DC ground fault waveform, 32 phase DC ground fault waveform, 161 frequency filter, 162 low pass filter, 163 voltage comparison unit, 163a first comparator, 163b second comparator, 164 absolute value generation unit, 165 DC ground fault detection terminal, 166 AC ground fault detection terminal, 265 ground fault detection terminal, A1, A2 deviation, f11 first frequency, f12 third frequency, f2 second frequency, R1 resistor, R2 resistor, S0 input voltage signal, S1 first voltage signal, S2 second voltage signal, SAC AC ground fault detection signal, SDC DC ground fault detection signal, SX ground fault detection signal, Vc neutral point potential, $V_{ref1}$ AC ground fault reference potential, $V_{CO2}$ DC ground fault reference potential, $V_{ref1}$ AC ground fault detection voltage, $V_{ref2}$ DC ground fault detection voltage

The invention claimed is:

1. A power conditioner comprising:
    an inverter circuit converting a DC voltage inputted via a positive electrode input terminal and a negative electrode input terminal into an AC voltage;
    a voltage dividing circuit having one end connected to the positive electrode input terminal and another end connected to the negative electrode input terminal; and
    a ground fault detector receiving a voltage divided by the voltage dividing circuit as an input voltage signal, and detecting an occurrence of a ground fault based on a magnitude of a voltage of the input voltage signal,
    wherein
    the ground fault detector comprises:
    a frequency filter receiving the input voltage signal, passing a first voltage signal having a frequency equal to or higher than a predetermined first frequency, and blocking a signal having a frequency lower than the first frequency;
    a first voltage comparison unit generating an AC ground fault detection signal when a deviation of the first voltage signal with respect to a predetermined first reference potential is equal to or greater than a predetermined first voltage; and
    a second voltage comparison unit generating a ground fault detection signal when a deviation of the input voltage signal with respect to a predetermined second reference potential is equal to or greater than a predetermined second voltage,
    the ground fault detector is configured to detect a DC ground fault in response to only the ground fault detection signal being generated, and detect an AC ground fault in response to both the ground fault detection signal and the AC ground fault detection signal being generated.

2. The power conditioner according to claim 1, wherein the frequency filter blocks a signal having a frequency higher than a third frequency which is set higher than the first frequency.

3. The power conditioner according to claim 1, further comprising at least one of an alarm unit outputting an alarm of an AC ground fault in response to the AC ground fault detection signal, and a recording unit recording an AC ground fault occurrence history in response to the AC ground fault detection signal.

4. A ground fault detector comprising:
    a frequency filter receiving an input voltage signal, passing a first voltage signal having a frequency equal to or higher than a predetermined first frequency, and blocking a signal having a frequency lower than the first frequency;
    a first voltage comparison unit generating an AC ground fault detection signal when a deviation of the first voltage signal with respect to a predetermined first reference potential is equal to or greater than a predetermined first voltage; and
    a second voltage comparison unit generating a ground fault detection signal when a deviation of the input voltage signal with respect to a predetermined second reference potential is equal to or greater than a predetermined second voltage,
    wherein the ground fault detector is configured to detect a DC ground fault in response to only the ground fault detection signal being generated, and detect an AC ground fault in response to both the ground fault detection signal and the AC ground fault detection signal being generated.

* * * * *